United States Patent [19]

Goto

[11] Patent Number: 5,736,871
[45] Date of Patent: Apr. 7, 1998

[54] DIFFERENTIAL PAIR INPUT BUFFER CIRCUIT WITH A VARIABLE CURRENT SOURCE

[75] Inventor: Hiroyuki Goto, Tokyo, Japan

[73] Assignee: NEC Corporation, Tokyo, Japan

[21] Appl. No.: 607,574

[22] Filed: Feb. 27, 1996

[30] Foreign Application Priority Data

Feb. 28, 1995 [JP] Japan ................. 7-040187

[51] Int. Cl.⁶ ..................... H03K 19/0948; H03F 3/45
[52] U.S. Cl. ............... 326/115; 326/34; 326/83; 327/56; 327/89; 330/253
[58] Field of Search ............... 326/83, 115, 68, 326/31, 33–34, 32, 23–24; 327/52, 53, 56, 77, 89, 563; 330/253–254

[56] References Cited

U.S. PATENT DOCUMENTS

| | | | |
|---|---|---|---|
| 5,175,451 | 12/1992 | Ihara | 327/89 |
| 5,317,214 | 5/1994 | Lewis | 327/63 |
| 5,339,045 | 8/1994 | Rusznyak | 327/77 |
| 5,343,086 | 8/1994 | Fung et al. | 327/77 |
| 5,451,898 | 9/1995 | Johnson | 327/53 |

Primary Examiner—Jon Santamauro

[57] ABSTRACT

In an input buffer circuit for use in a semiconductor integrated circuit, comprising a differential pair formed of a pair of MOS transistors and receiving a reference voltage and an input signal supplied from an external, a first constant current source MOS transistor connected to the differential pair, and a load circuit connected to the differential pair, a second constant current source MOS transistor is connected in parallel to the first constant current source MOS transistor. A gate voltage of the second constant current source MOS transistor is controlled by a reference voltage converting circuit which receives the reference voltage. When the reference voltage elevates, the reference voltage converting circuit elevates the gate voltage of the second constant current source MOS transistor, so as to reduce an ON resistance of the second constant current source MOS transistor, thereby changing a source potential of the pair of MOS transistors of the differential pair in the same direction as that of the change of the reference voltage.

6 Claims, 3 Drawing Sheets

DIFFERENTIAL PAIR INPUT BUFFER CIRCUIT WITH A VARIABLE CURRENT SOURCE

BACKGROUND OF THE INVENTION

1. Field of the Invention

The present invention relates to an input buffer circuit for use in a semiconductor integrated circuit, and more specifically to a MOS differential amplifier type input buffer circuit for use in a semiconductor integrated circuit, and for interfacing an amplitude smaller than a TTL level in a low voltage range, for example, not larger than 3.3 V.

2. Description of Related Art

Various standards for this small amplitude interface have been defined with the purpose of causing an LSI (large scale integrated circuit) to operate at a high speed with an amplitude smaller than that of a conventional TTL (transistor-transistor logic) level operation. These standards are premised on a condition that a MOS (metal-oxide-semiconductor field effect transistor) differential amplifier type input buffer circuit is used which is capable of quickly responding to an input signal of a small amplitude so as to transfer the received signal to an internal circuit of the LSI chip Referring to FIG. 1, there is shown a circuit diagram of a conventional MOS differential amplifier type input buffer circuit. The input buffer circuit shown in FIG. 1 includes a differential pair composed of a pair of pMOS (P-channel MOS) transistors MP3 and MP4 having a source electrode thereof connected in common to each other. A load connected to this differential pair is an active load composed of a pair of nMOS (N-channel MOS) transistors MN1 and MN2 connected in the form of a current mirror. Namely, a drain electrode and a gate electrode of the load transistor MN2 are connected to each other and also connected to a drain electrode of the transistor MP4 of the differential pair and a gate electrode of the load transistor MN1. A drain electrode of the load transistor MN1 are connected to a drain electrode of the transistor MP3 of the differential pair. A source electrode of each of the load transistors MN1 and MN2 is connected to a ground line.

The common-connected source electrodes of the transistors MP3 and MP4 of the differential pair are connected to a high potential power supply line (=Vcc) through a constant current source formed of a gate-grounded pMOS transistor MP1.

In the above mentioned circuit, a reference voltage Vref is applied front an external of this circuit to a gate electrode of one transistor MP4 of the differential pair, and an input signal In is applied to a gate electrode of the other transistor MP3 of the differential pair. An output signal Out is extracted from the drain electrode of the other transistor MP3 of the differential pair, and supplied to an internal circuit 30 of the LSI chip, which is depicted as a CMOS (complementary MOS circuit) inverter as one example.

In the input buffer circuit shown in FIG. 1, when a voltage of the input signal In is higher than the reference voltage Vref, a gate-source voltage of the transistor MP4 of the differential pair is larger than a gate-source voltage of the transistor MP3 of the differential pair, and therefore, the transistor MP3 of the differential pair is put in a condition "weaker" than that of the transistor MP4 of the differential pair, namely, has a current driving capacity smaller than that of the transistor MP4. On the other hand, since the load transistors MN1 and MN2 constitute the current mirror as mentioned above, the load transistors MN1 and MN2 have the same current driving capacity. Accordingly, the drain voltage of the transistor MP3, namely, the level of the output signal Out becomes lower than the drain voltage of the transistor MP4 by the amount by which the current driving capacity of the transistor MP3 is smaller than that of the transistor MP4. On the other hand, when the voltage of the input signal In is lower than the reference voltage Vref, the transistor MP3 is put in a condition "stronger" than that of the transistor MP4, so that the level of the output signal Out becomes high.

As mentioned above, the output signal Out lowers when the input signal In is higher than the reference voltage Vref, and elevates when the input signal In is lower than the reference voltage Vref. Here, an operating point of the differential amplifier is a point where a voltage change of the output signal Out becomes maximum with a voltage change of the input signal with the reference voltage Vref being as the center. In other words, at the operating point, the change of the output voltage to the change of the input voltage (namely, sensitivity) becomes maximum. Accordingly, it is very important in the circuit characteristics that the operating point of the differential amplifier circuit is consistent with the input reference voltage Vref. However, since the "input reference voltage Vref" is a value given from an external as a "standard", it is not possible to arbitrarily change the input reference voltage Vref. Therefore, it is necessary to determine the circuit construction, the element characteristics and the circuit constants in the differential amplifier circuit in order to make the "operating point" consistent with the "standard of the input reference voltage". For the purpose of making the "operating point" consistent with the "standard of the input reference voltage", it is a conventional practice to change the current supplying capacity of individual transistors, in other words, to change a channel length or a channel width of individual MOS transistors, namely, a W/L (width to length) ratio.

For example, in the example shown in FIG. 1, by enlarging the channel width of the constant current source transistor MP1 while maintaining the channel length as it is, an on-resistance of this transistor decreases, so that the common source voltage of the differential pair transistors MP3 and MP4 elevates, with the result that the operating point correspondingly elevates. On the other hand, by enlarging the channel width of both the load transistors MN1 and MN2, the operating point drops. Incidentally, since the channel size of the differential pair transistors MP3 and MP4 influences the operating speed, it is preferred to avoid to greatly change the channel W/L ratio of the differential pair transistors MP3 and MP4.

As one example, it is assumed that the conventional MOS differential amplifier type input buffer circuit shown in FIG. 1 is so designed that the standard of the input reference voltage is for example 0.6 V, and the respective channel W/L ratio of the transistors MP1, MN1, MN2, MP3 and MP4 are determined to make the operating point consistent with this voltage of 0.6 V. In this case, if the standard of the input reference voltage becomes for example 1.0 V, it becomes that the voltage of the output signal Out does not almost change even if the voltage of the input signal In changes. As a result, it becomes impossible to invert the inverter of the internal circuit 30.

It is a matter of course that the input buffer circuit is preferred to maintain the original sensitivity, even if the input reference voltage greatly changes after the operating point of the circuit is determined. As mentioned above, however, the extent of capable of maintaining the sensitivity is limited. In the above mentioned case, for example, the range of the input reference voltage which does not greatly deteriorate the sensitivity and the operation speed of the circuit was about 0.5 V to 0.7 V. If the center of the reference voltage Vref is set to 0.9 V, the range of the input reference voltage which does not greatly deteriorate the sensitivity and the operation speed of the circuit was about 0.8 V to 1.0 V.

As mentioned above, in the MOS differential amplifier type input buffer circuit of the conventional semiconductor integrated circuit, it has to be so designed to make the operating point of the input buffer circuit consistent with an input reference voltage based on a given specific specification by optimizing respective sizes (channel W/L ratio) of transistors included in the input buffer circuit. In other words, when the input reference voltage is changed, it is necessary to change the sizes of the transistors so as to meet with the changed input reference voltage. However, the sizes of the transistors are determined at the manufacturing stage, and it is no longer possible to modify the sizes of the transistors after the integrated circuit is finished. As a result, the range of the input reference voltage in which the input buffer circuit optimized once can be effectively used, is limited to an extremely narrow range. Accordingly, in order to change the specification of the input reference voltage, it is necessary to manufacture another input buffer by optimizing the sizes of the transistors in accordance with the changed specification of the input reference voltage. Thus, a separate LSI chip must be manufactured for each different specification.

SUMMARY OF THE INVENTION

Accordingly, it is an object of the present invention to provide an input buffer circuit for use in a semiconductor integrated circuit, which has overcome the above mentioned defect of the conventional one.

Another object of the present invention is to provide a MOS differential amplifier type input buffer circuit for use in a semiconductor integrated circuit, and capable of being used in an enlarged range of input reference voltage without deteriorating the characteristics of the circuit.

The above and other objects of the present invention are achieved in accordance with the present invention by an input buffer circuit for use in a semiconductor integrated circuit, comprising a differential pair formed of a pair of MOS transistors and receiving a reference voltage and an input signal supplied from an external source, a constant current source having a first constant current source MOS transistor connected to the differential pair for supplying a constant current to the differential pair, a load circuit connected to the differential pair, a second constant current source MOS transistor connected in parallel to the first constant current source MOS transistor, and a reference voltage converting means connected to receive the reference voltage for controlling a gate voltage applied to a gate electrode of the second constant current source MOS transistor, so as to change an ON resistance of the second constant current source MOS transistor, thereby changing a source potential of the pair of MOS transistors of the differential pair in the same direction as that of the change of the reference voltage.

The above and other objects, features and advantages of the present invention will be apparent from the following description of preferred embodiments of the invention with reference to the accompanying drawings.

DESCRIPTION OF THE PREFERRED EMBODIMENTS

Figure 1:
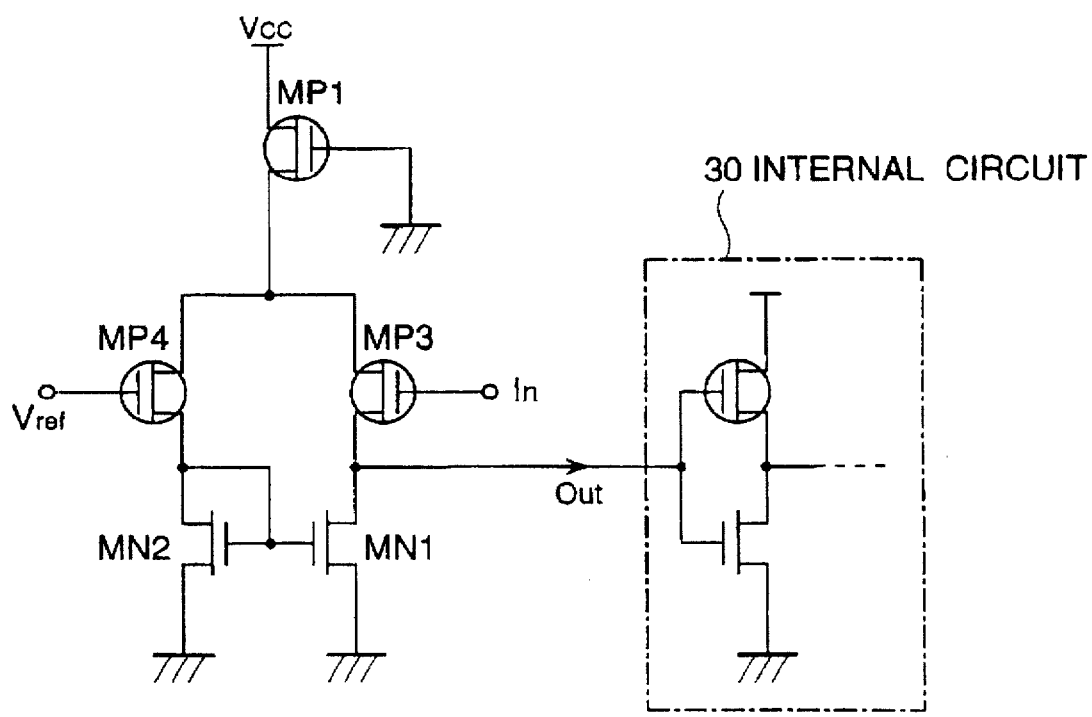
FIG. 1 is a circuit diagram of a conventional MOS differential amplifier type input buffer circuit.
Figure 2A:
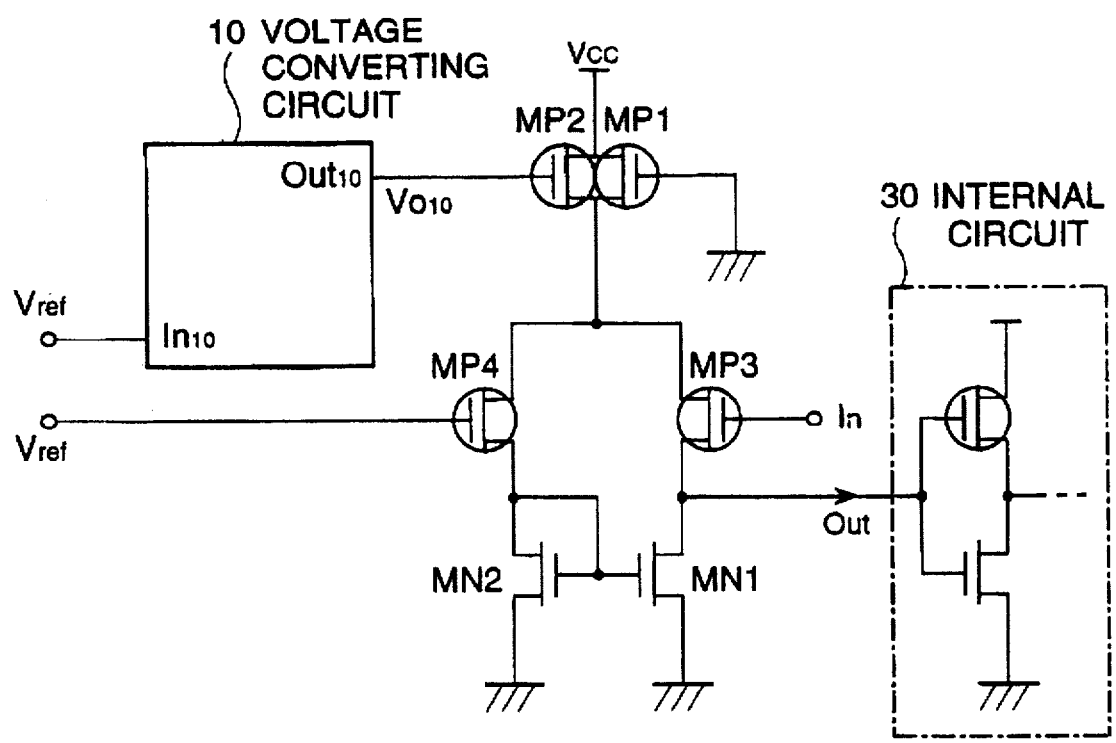
FIG. 2A is a circuit diagram of a first embodiment of the MOS differential amplifier type input buffer circuit in accordance with the present invention.

Referring to FIG. 2A, there is shown a circuit diagram of a first embodiment of the MOS differential amplifier type input buffer circuit in accordance with the present invention. In FIG. 2A, elements similar or corresponding to those shown in FIG. 1 are given the Reference Numerals, and explanation thereof will be omitted for simplification of description.

As seen from comparison between FIGS. 1 and 2A, the constant current structure of the first embodiment is different from that of the conventional MOS differential amplifier type input buffer circuit shown in FIG. 1. The constant current structure of the first embodiment includes a parallel circuit composed of two pMOS transistors MP1 and MP2, and a voltage converting circuit 10. A gate electrode of the transistor MP1 is connected to the ground, similarly to the conventional MOS differential amplifier type input buffer circuit. On the other hand, a gate electrode of the newly added transistor MP2 is connected to receive an output voltage VO10 of the voltage converting circuit 10.

Figure 2B:
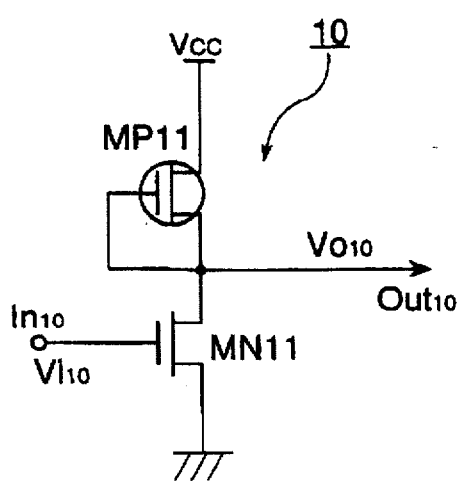
FIG. 2B is a circuit diagram of the voltage converting circuit used in the MOS differential amplifier type input buffer circuit shown in FIG. 2A.

As shown in FIG. 2B, this voltage converting circuit 10 includes a pMOS transistor MP11 and an nMOS transistor MN11 connected in series between a high potential power supply line and a ground line. A source electrode of the transistor MP11 is connected to the high potential power supply line, and a gate electrode of the transistor MP11 is connected to a drain electrode of the transistor MP11 itself. On the other hand, a drain electrode of the transistor MN11 is connected to the drain electrode of the transistor MP11, and a source electrode of the transistor MN11 is connected to the ground. A gate electrode of the transistor MN11 is connected to an input node In10, which receives an input voltage Vi10 (=reference voltage Vref). An output node Out10 of the voltage converting circuit 10 is a connection node between the two transistors MP11 and MN11, namely, the drain electrodes of the transistors MP11 and MN11. The output voltage VO10 of the output node Out10 is applied to the gate electrode of the second transistor MP2 of the constant current source.

Figure 2C:
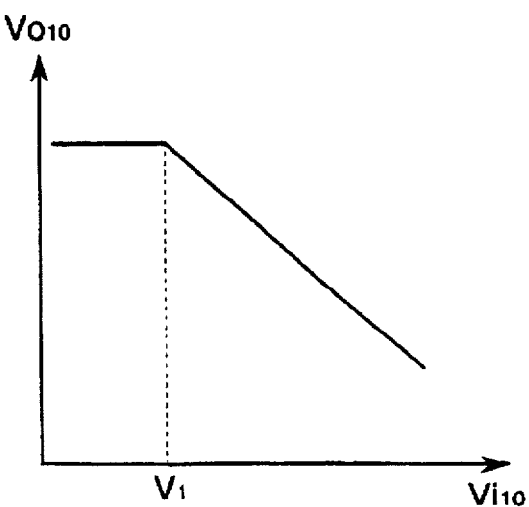
FIG. 2C is a graph illustrating an input-to-output characteristics of the voltage converting circuit shown in FIG. 2B.

Referring to FIG. 2C, there is shown a graph illustrating an input-to-output characteristics of the voltage converting circuit 10 shown in FIG. 2B. When the input voltage Vi10 is lower than an input threshold V1 of the transistor MN11, the transistor MN11 is in an cut-off condition, and therefore, the output voltage VO10 is constant independently of the input voltage Vi10. When the input voltage Vi10 exceeds the input threshold V1 of the transistor MN11, the transistor MN11 is put in an conductive condition, and the on-resistance of the transistor MN11 drops with elevation of the input voltage Vi10.

In this embodiment, the reference voltage Vref is applied as the input voltage Vi10 to the voltage converting circuit 10 having the above mentioned characteristics, and the output voltage VO10 is applied to the gate electrode of the second transistor MP2 of the constant current source, so as to control the current supplying capacity of the second transistor MP2 of the constant current source. Namely, when the reference voltage Vref changes and becomes higher than the input threshold V1 of the transistor MN11, the output voltage VO10 of the voltage converting circuit 10, namely the gate voltage of the second transistor MP2 of the constant current source drops. If the gate voltage of the second transistor MP2 becomes lower than Vcc−|VTP| (where VTP is a threshold of the pMOS transistor MP2), the transistor MP2 is rendered conductive. As a result, the transistor MP2 is added in parallel to the transistor MP1 which has supplied the current as the constant current source, so that the current supply capacity of the constant current source is increased with the elevation of the input reference voltage Vref, and a resistance between the high potential power supply line and the differential pair decreases. As a result, the source voltage of the transistors MP3 and MP4 of the differential pair elevates toward the high potential power supply voltage Vcc. In other words, the source voltage of the transistors MP3 and MP4 of the differential pair elevates to follow the elevation of the input reference voltage Vref, in the same direction as that of the elevation of the input reference voltage Vref. Thus, the gate-source voltage of the two transistors MP3 and MP4 follows the elevation of the input reference voltage Vref, with the result that the consistency between the operating point of the differential amplifier and the input reference voltage Vref is ceaselessly maintained, so that the LSI chip can be used in a wide range of the input reference voltage Vref.

For example, the operating range, which was on the order of only 0.8 V to 1.0 V in the prior art, can be extended to 0.5 V to 1.5 V, in this embodiment. As a result, the same LSI chip can be used in different input reference voltage standards, for example, in GTL (Gunning Transceiver Logic) having the input reference voltage Vref=0.6 V, and in HSTL (High Speed Transceiver Logic) having the input reference voltage Vref=0.9 V(max).

Figure 3A:
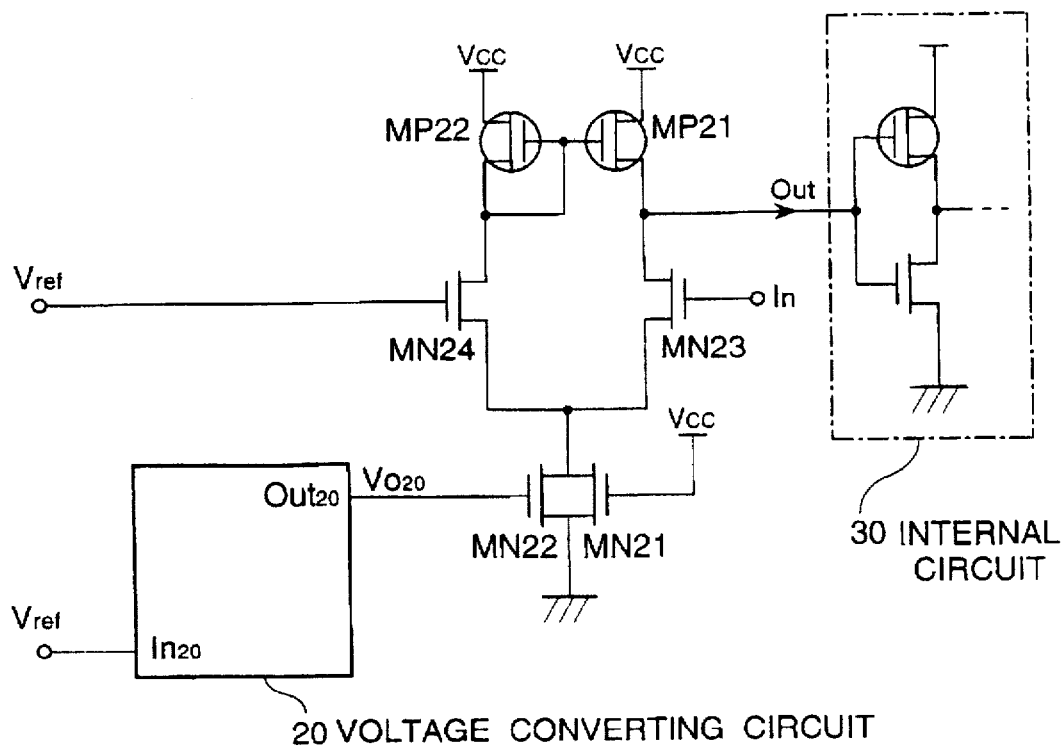
FIG. 3A is a circuit diagram of a second embodiment of the MOS differential amplifier type input buffer circuit in accordance with the present invention.

Referring to FIG. 3A, there is shown a circuit diagram of a second embodiment of the MOS differential amplifier type input buffer circuit in accordance with the present invention. This second embodiment is one obtained by inverting the conductivity type of the respective MOS transistors in the first embodiment shown in FIG. 2A The second embodiment includes a differential pair composed of a pair of nMOS transistors MN23 and MN24 having a source electrode thereof connected in common to each other. A gate electrode of the nMOS transistor MN23 is connected to receive an input signal In, and a gate electrode of the nMOS transistor MN24 is connected to receive the reference voltage Vref. An load connected to this differential pair is composed of a current mirror formed of a pair of pMOS transistors MP21 and MP22. A drain electrode and a gate electrode of the load transistor MP22 are connected to each other and also connected to a drain electrode of the transistor MN24 of the differential pair and a gate electrode of the load transistor MP21. A drain electrode of the load transistor MP21 are connected to a drain electrode of the transistor MN23 of the differential pair. A source electrode of each of the load transistors MP21 and MP22 is connected to a high potential power supply line (=Vcc). A connection node between the transistors MN23 and MP21 constitutes an output node Out, which is connected to an internal circuit 30 of the LSI chip such as a CMOS inverter.

The common-connected source electrodes of the transistors MN23 and MN24 of the differential pair are connected to a ground line through a constant current source which is formed of a parallel circuit composed of an nMOS transistor MN21 having a gate electrode connected to the high potential power supply line Vcc, and another nMOS transistor MN22 having a gate electrode connected to receive an output voltage VO20 of a voltage convening circuit 20.

Figure 3B:
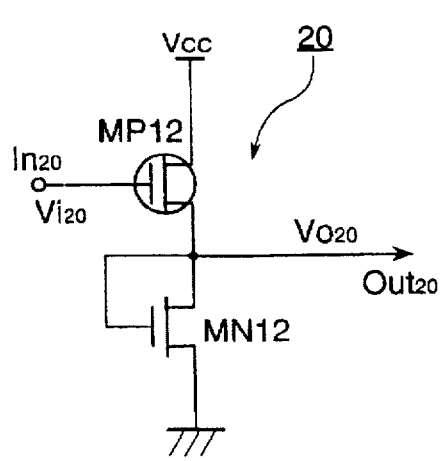
FIG. 3B is a circuit diagram of the voltage converting circuit used in the MOS differential amplifier type input buffer circuit shown in FIG. 3A.

As shown in FIG. 3B, which is a circuit diagram of the voltage converting circuit 20, the voltage converting circuit 20 includes a pMOS transistor MP12 and an nMOS transistor MN12 connected in series between the high potential power supply line and the ground line. A source electrode of the transistor MP12 is connected to the high potential power supply line, and a gate electrode of the transistor MP12 is connected to an input node In20 for receiving an input voltage Vi20 (=reference voltage Vref). On the other hand, a drain electrode of the transistor MN12 is connected to the drain electrode of the transistor MP12 and a gate electrode of the transistor MN12 itself, and a source electrode of the transistor MN12 is connected to the ground. The output node, Out20 of the voltage converting circuit 20 is a connection node between the two transistors MP12 and MN12, namely, the drain electrodes of the transistors MP12 and MN12. The output voltage VO20 of file output voltage VO20 is applied to the gate electrode of the second transistor MN22 of the constant current source.

Figure 3C:
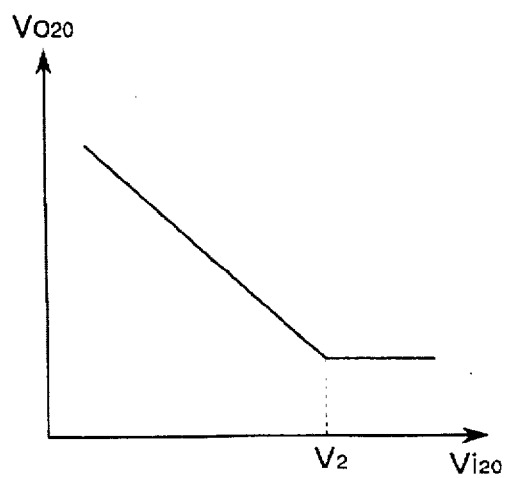
FIG. 3C is a graph illustrating an input-to-output characteristics of the voltage converting circuit shown in FIG. 3B.

Referring to FIG. 3C, there is shown a graph illustrating an input-to-output characteristics of the voltage converting circuit 20 shown in FIG. 3B. When the input voltage Vi20, namely the reference voltage Vref is higher than V2 (=VCC−|VTP| where VTP is an input threshold of the transistor MP12), the transistor MP12 is in an cut-off condition, and therefore, the output voltage VO20 is constant independently of the input voltage Vi20. When the reference voltage Vref becomes lower than V2, the transistor MP12 is put in an conductive condition, and the on-resistance of the transistor MP12 drops with a drop of the reference voltage Vref.

In this second embodiment, when the reference voltage Vref drops, the second transistor MN22 of the constant current source becomes conductive so as to elevate the current supply capacity of the constant current source. Therefore, the source voltage of the transistors MN23 and MN24 of the differential pair drops. Namely, the source voltage of the transistors MN23 and MN24 of the differential pair drops to follow the drop of the input reference voltage Vref, in the same direction as that of the drop of the input reference voltage Vref. Thus, the gate-source voltage of the two transistors MN23 and MN24 follows the drop of the input reference voltage Vref, with the result that the gate-source voltage of the two transistors MN23 and MN24 and the input reference voltage Vref are maintained to be ceaselessly consistent with each other, so that the LSI chip can be used in a wide range of the input reference voltage Vref.

This second embodiment has a wide operating range of the input reference voltage at a voltage level higher than that of the first embodiment. For example, the operating range of the first embodiment was 0.5 V to 1.5 V, but the second embodiment can have the operating range of 1.5 V to 2.5 V. As a result, the same LSI chip can be used in different input reference voltage standards, for example, in CTT (Center Tapped Termination) having the input reference voltage Vref=1.5 V, and in PECL (Positive ECL) having the input reference voltage Vref=1.95 V.

As seen from the above, the present invention is characterized in that, in an input buffer circuit for use in a semiconductor integrated circuit, comprising a differential pair, a first constant current source MOS transistor connected to the differential pair, and a load circuit connected to the differential pair, a second constant current source MOS transistor is added to be connected in parallel to the first constant current source MOS transistor. A gate voltage of the second constant current source MOS transistor is changed in accordance with a change of a reference voltage, so as to change an ON resistance of the second constant current source MOS transistor, thereby changing a source potential of the differential pair in the same direction as that of the change of the reference voltage.

With this arrangement, even if the input reference voltage is changed, the gate-source voltage of the differential pair transistors is controlled to be ceaselessly consistent with the input reference voltage. Therefore, the same LSI chip can be used in a wide range of the input reference voltage. Accordingly, it is no longer necessary to independently manufacture the LSI chip for each different input reference voltage level.

The invention has thus been shown and described with reference to the specific embodiments. However, it should be noted that the present invention is in no way limited to the details of the illustrated structures but changes and modifications may be made within the scope of the appended claims.

I claim:

1. An input buffer circuit for use in a semiconductor integrated circuit, comprising a differential pair formed by a pair of MOS transistors and receiving a reference voltage and an input signal supplied from an external source, a constant current source having a first constant current source MOS transistor connected to said differential pair for supplying a constant current to said differential pair, a load circuit connected to said differential pair, a second constant current source MOS transistor connected in parallel to said first constant current source MOS transistor, and a reference voltage converting means connected to receive said reference voltage for controlling a gate voltage applied to a gate electrode of said second constant current source MOS transistor so as to change an ON resistance of said second constant current source MOS transistor, thereby changing a source potential of said pair of MOS transistors of said differential pair in the same direction as that of the change of said reference voltage, wherein said pair of MOS transistors of said differential pair has a source electrode thereof connected in common to each other, a gate electrode of one of said pair of MOS transistors being connected to receive said reference voltage and a gate electrode of the other of said pair of MOS transistors being connected to receive said input signal, and wherein said load circuit is connected between said differential pair and a first power supply terminal, and said first constant current source MOS transistor is connected between a second power supply terminal and the common-connected source electrodes of said pair of MOS transistors of said differential pair, a gate electrode of said first constant current source MOS transistor being connected to a fixed voltage so as to supply said constant current to said differential pair.

2. A input buffer circuit claimed in claim 1 wherein said reference voltage converting means includes a first MOS transistor of a first conductivity type having a source electrode thereof connected to said second power supply terminal and a gate electrode thereof and a drain electrode thereof connected in common to an output node connected to said gate electrode of said second constant current source MOS transistor, and a second MOS transistor of a second conductivity type opposite to said first conductivity type, having a source electrode thereof connected to said first power supply terminal, a drain electrode thereof connected to said output node, and a gate electrode thereof connected to receive said reference voltage.

3. A input buffer circuit claimed in claim 2 wherein said load circuit is constituted of a current mirror circuit including a third MOS transistor of said second conductivity having a source electrode thereof connected to said first power supply terminal and a drain electrode thereof connected to said drain electrode of said other transistor of said pair of MOS transistors, and a fourth MOS transistor of said second conductivity having a source electrode thereof connected to said first power supply terminal and a gate electrode thereof and a drain electrode thereof connected to said drain electrode of said one transistor of said pair of MOS transistors and to a gate electrode of said third MOS transistor.

4. A input buffer circuit claimed in claim 1 wherein said load circuit is constituted of a current mirror circuit including a third MOS transistor of a second conductivity having a source electrode thereof connected to a first power supply terminal and a drain electrode thereof connected to said drain electrode of said other transistor of said pair of MOS transistors, and a fourth MOS transistor of said second conductivity having a source electrode thereof connected to said first power supply terminal and a gate electrode thereof and a drain electrode thereof connected to said drain electrode of said one transistor of said pair of MOS transistors and to a gate electrode of said third MOS transistor.

5. An input buffer circuit for use in a semiconductor integrated circuit, comprising a differential pair formed of a pair of MOS transistors and receiving a reference voltage and an input signal supplied from an external source, a constant current source connected between said differential pair and a first power supply terminal, a load circuit between said differential pair and a second power supply terminal, and a reference voltage converting means receiving said reference voltage for controlling said constant current source so as to change a source potential of said pair of MOS transistors of said differential pair in the same direction as that of a change of said reference voltage, wherein said constant current source includes a first constant current source MOS transistor connected between said differential pair and said first power supply terminal and having a gate electrode thereof connected to a fixed bias voltage, and a second constant current source MOS transistor connected in parallel to said first constant current source MOS transistor and having a gate electrode thereof connected to receive a gate voltage which is supplied from said reference voltage converting means and which is controlled by said reference voltage converting means in such a manner that when said reference voltage elevates, said reference voltage converting means elevates said gate voltage of said second constant current source MOS transistor, so as to reduce an ON resistance of said second constant current source MOS transistor, thereby changing said source potential of said pair of MOS transistors of said differential pair in the same direction as that of the change of said reference voltage.

6. An input buffer circuit for a semiconductor integrated circuit receiving an input signal having a predetermined amplitude, which is supplied from an external source of said semiconductor integrated circuit, comprising:

a differential circuit including a first transistor receiving said input signal and a second transistor receiving a reference voltage which is supplied from an external source of said semiconductor integrated circuit;

a voltage converting circuit for converting said reference voltage to a converted voltage;

a first current source connected to said differential circuit for supplying a constant current; and a second current source connected in parallel with said first current source and connected to said differential circuit to supply an additional current controlled by said converted voltage to equate an operating point of said differential circuit with said reference voltage.

* * * * *